United States Patent [19]

Schrantz

[11] Patent Number: 5,120,669
[45] Date of Patent: Jun. 9, 1992

[54] METHOD OF FORMING SELF-ALIGNED TOP GATE CHANNEL BARRIER REGION IN ION-IMPLANTED JFET

[75] Inventor: Gregory A. Schrantz, Melbourne, Fla.

[73] Assignee: Harris Corporation, Melbourne, Fla.

[21] Appl. No.: 651,460

[22] Filed: Feb. 6, 1991

[51] Int. Cl.⁵ .................. H01L 21/236; H01L 21/266
[52] U.S. Cl. .......................................... 437/41; 437/29; 437/45; 437/154; 437/911; 437/978; 148/DIG. 13; 148/DIG. 106
[58] Field of Search ............... 437/40, 911, 41, 45, 437/150, 151, 152, 153, 154, 28, 29, 978, 27; 148/DIG. 13, DIG. 106

[56] References Cited

U.S. PATENT DOCUMENTS

| | | | |
|---|---|---|---|
| 3,725,136 | 4/1973 | Morgan | 437/911 |
| 3,761,328 | 9/1973 | Abe et al. | 437/911 |
| 3,787,962 | 1/1974 | Yoshida et al. | 437/41 |
| 3,928,082 | 12/1975 | Schwettmann et al. | 437/31 |
| 4,111,726 | 9/1978 | Chen | 437/31 |
| 4,172,741 | 10/1979 | Johnson | 437/911 |
| 4,393,575 | 7/1983 | Dunkley et al. | 437/911 |
| 4,456,918 | 6/1984 | Beasom | 357/41 |
| 4,573,257 | 3/1986 | Hulseweh | 437/26 |
| 4,635,345 | 1/1987 | Hankins et al. | 437/150 |
| 4,683,485 | 7/1987 | Schrantz | 357/15 |
| 4,764,482 | 8/1988 | Hsu | 437/57 |
| 4,804,634 | 2/1989 | Krishma et al. | 437/32 |
| 4,816,880 | 3/1989 | Muro | 357/41 |

OTHER PUBLICATIONS

Sze, S. M., ed., *VLSI Technology*, McGraw Hill, 1983, pp. 218–225.

Nicollian, E. H., et al., MOS Physics and *Technology*, John Wiley & Sons, 1982, pp. 548–549.

Primary Examiner—T. N. Quach
Attorney, Agent, or Firm—Evenson, Wands, Edwards, Lenahan & McKeown

[57] ABSTRACT

An ion-implanted JFET has a channel barrier region at the top gate surface self-aligned to the source and drain, thereby maintaining sufficient separation between the channel barrier and the source and drain for attaining a high source/drain breakdown voltage. After a top gate and an underlying channel layer are ion-implanted through a thin oxide layer, a first photoresist layer is formed and patterned to expose surface portions of the thin oxide layer where source, drain and channel barrier regions are to be formed. Through these apertures in the first photoresist mask, shallow high impurity concentration surface region are ion-implanted. A second photoresist layer is formed on the first photoresist layer, and patterned to completely expose the first and second apertures in the first photoresist layer and to remove material of the second photoresistor layer down to the surface of the the oxide layer, while masking the barrier region. Source and drain regions are then implanted through the second photoresist layer and the exposed first and second apertures of the first mask. The dose and implantation energy is such that the second implant effectively overrides the shallow regions of the first implant. Because the locations at which the source and drain regions in the underlying semiconductor material are formed are defined by the pattern in the first photoresist mask, the source and drain regions are self-aligned with the barrier region.

8 Claims, 1 Drawing Sheet

METHOD OF FORMING SELF-ALIGNED TOP GATE CHANNEL BARRIER REGION IN ION-IMPLANTED JFET

This is a continuation of application Ser. No. 302,338, filed Jan. 27, 1989, now abandoned.

FIELD OF THE INVENTION

The present invention relates in general to semiconductor devices and is particularly directed to a methodology for forming a junction field effect transistor (JFET) having an ion-implanted channel, ion-implanted top gate structure.

BACKGROUND OF THE INVENTION

Ion-implanted junction field effect transistors (hereinafter termed I²JFETs) typically contain a buried (ion-implanted) channel region which bridges or joins respective source and drain regions of the JFET and the conductive properties of which are controlled by modulation of the space-charge region width formed with the adjoining top gate and bottom gate regions. Where the top gate has been formed of a single continuous layer, the resulting device is subject to drain-source punch-through at the (thin oxide) insulator interface with the top gate. The mechanism which gives rise to this punch-through effect differs for P- channel and N-channel JFETs.

More specifically, in a PJFET device (P-channel) the thin oxide layer overlying the surface of the device, and through which the top gate and conductive channel therebeneath are implanted, traps electrons (due to the presence of ion-implanted N-type impurities (e.g. phosphorous or arsenic) within oxide). Namely, the density of trapped electrons within the oxide is of sufficient concentration to cause the formation of a depletion region extending from source to drain, or even an inversion region, in the N-type gate surface layer at the oxide interface. For a discussion of this phenomenon, attention may be directed to a book entitled "MOS Physics and Technology" by E.H. Nicollian and J.R. Brews, Wiley, New York, 1982, Chapter 11, pp. 548-549.

In an NJFET (N-channel device), the surface depletion of the top gate (P-type) is principally caused by segregation of P-type impurities (e.g. boron) which, in the worst case, will overcome any beneficial effect of implanted phosphorous-induced electron-trapping. In addition, NJFETs are more likely to undergo surface inversion due to gamma radiation-induced fixed positive oxide charge.

To counter or overcome the drain-source punch-through effect, a high concentration region, which effectively acts as a barrier to drain-source punch-through may be formed in the top gate layer. The provision of such a region is described in my earlier filed patent entitled "Technique for Increasing Gate Drain Breakdown Voltage of Ion-Implanted JFET" issued Jul. 28, 1987, U.S. Pat. No. 4,683,485 and assigned to the Assignee of the present application.

As described in that patent, a high impurity concentration region of the same conductivity type as the top gate results in an impurity distribution profile at the surface of the device, which effectively makes up for the lack of charge carriers available from the top gate when the device is biased near pinch-off, thereby preventing the top gate structure from being fully depleted of charge carriers.

As the operational frequencies at which linear devices, such as the above described JFET continue to increase, dimensional tolerances of the device geometries become more critical. Where the JFET source-drain separation is reduced to a distance on the order of 7 to 8 microns, it becomes very difficult to form the high impurity concentration channel barrier region within the top gate without degrading the drain/source breakdown voltage which must be maintained in the range of 20V–40V. In other words, precise alignment of the high impurity concentration barrier region with the very closely spaced source and the drain is a critical requirement in shallow channel applications.

SUMMARY OF THE INVENTION

In accordance with the present invention, there is provided a new and improved manufacturing process for forming an ion implanted JFET in which a high impurity concentration, channel barrier region may be effectively self-aligned to the source and drain, and thereby provide the necessary spacing between the channel barrier and the source and drain for achieving the requisite source/drain breakdown voltage.

Pursuant to the present invention, within an aperture in a substantially thick field oxide overlying the surface of the semiconductor substrate into which the JFET is to be formed, a thin oxide layer (having a thickness on the order of 100Å to 1,500Å) is grown. A top gate layer and an underlying channel layer are then ion-implanted through the thin oxide layer, such that the top gate layer extends from the underlying channel layer to the interface of the thin oxide layer with the surface of the substrate. Next, a first photoresist layer is formed over the field oxide and the thin oxide and selectively patterned to form three apertures therethrough to the surface of the thin oxide layer. The first of the apertures defines the location of the source region to be formed, the second aperture defines the location of the drain region to be formed, and a third aperture defines the location of a channel barrier region to be formed in the top gate between the source and drain regions. Through these three apertures in the photoresist masking layer, high impurity concentration (relative to the impurity concentration of the top gate layer) surface regions of the same conductivity type as the top gate are ion-implanted.

Next, a second photoresist layer is formed atop the first photoresist layer, filling the three apertures in the first photoresist layer. The second photoresist layer is then selectively patterned to completely expose the first and second apertures in the first photoresist layer and to remove material of the second photoresist layer therefrom down to the surface of the thin oxide layer. Patterning of the second photoresist layer, however, does not remove material from the third aperture in the first photoresist layer, so that the high impurity concentration region therebeneath is effectively completely masked by the second photoresist layer.

Following the second photoresist patterning step, ions of the same conductivity type as the underlying channel are implanted through apertures in the second photoresist layer and the exposed first and second apertures of the first photoresist layer. The dose and implantation energy is such that the implanted ions of the second implant form regions that are superimposed on the previously formed regions formed in the first and second apertures during the first implantation step and extend through the top gate layer down into the underlying channel layer. The second implant effectively provides source and drain regions through the first and second apertures in the first photoresist layer. Because the locations at which the source and drain regions in the underlying semiconductor material are formed are defined by the pattern in the first photoresist mask, the source and drain regions are self-aligned with the previously implanted high impurity concentration barrier region, which is masked by the second photoresist layer. The impurity concentration of the source and drain region implants is sufficient to override or compensate for the impurity concentration of the opposite conductivity regions formed at the surface of the top gate during the first implant.

Following the second implant step, the overlying first and second photoresist layers are removed and the implanted ion regions are activated by an anneal step.

Thereafter, a subsequent photoresist mask is patterned to form contact apertures through the oxide and contact metal is formed to complete the device.

DETAILED DESCRIPTION

Figure 1:
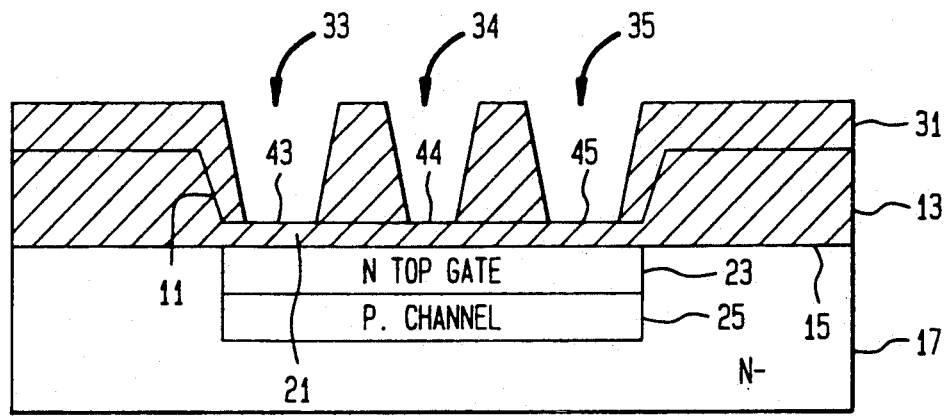
FIGS. 1–3 are diagrammatic cross-sectional illustrations of an ion-implanted JFET having a channel barrier region formed in the top gate during successive steps of the self-alignment masking/implant process of the present invention.
Figure 2:
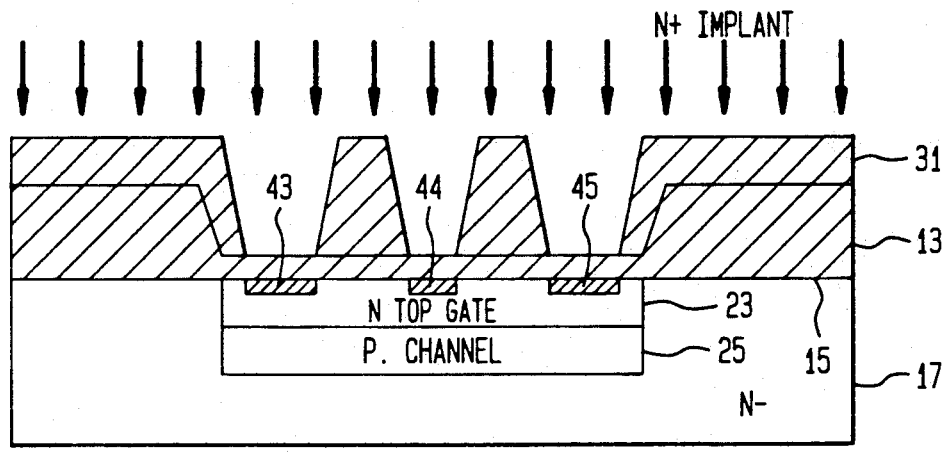
Figure 3:
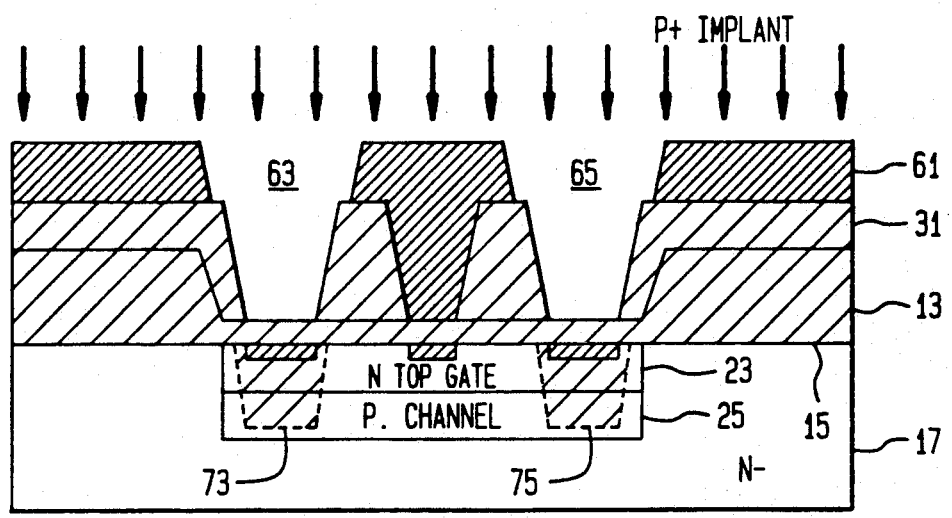

Referring now to FIGS. 1–3, there are shown diagrammatic cross-sectional illustrations of an ion-implanted P-channel JFET having an N+ channel barrier region formed in the top N-gate in accordance with the self-alignment masking/implant process of the present invention. Although the processing sequence will relate to the formation of a P-channel device, it should be understood that such device is given only as an example and is not limitative of the invention. The process is equally applicable to N-channel JFETs with corresponding use of complementary conductivity type semiconductor materials.

As an initial step of the inventive process, within an aperture 11 in a substantially thick (e.g. on the order of at least 5000 Ansgtroms) field oxide 13 overlying the substantially planar surface 15 of an N- type semiconductor substrate (e.g. N-doped silicon) 17 into which the P-channel JFET is to be formed, a thin oxide layer 21 (having a thickness on the order of 100Å to 1,500Å) is grown (see FIG. 1). An N-type top gate layer 23 having a thickness on the order of 0.05 to 0.4 microns and an underlying P-type channel layer 25 having a depth from surface 15 on the order of 0.15 to 0.9 microns are then sequentially ion-implanted through thin oxide layer 21, such that top gate layer 23 extends from the underlying channel layer 25 to the interface of the thin oxide layer 21 with the surface 15 of substrate 17. Each of ion-implanted layers 23 and 25 may have an implanted dose on the order of $10^{12}$ cm$^{-2}$.

Next, a photoresist layer (such as a negative photoresist) 31 is formed over field oxide 13 and thin oxide layer 21 and then selectively patterned to form spaced-apart apertures 33, 34 and 35 which extend to and expose respective surface portions 43, 44 and 45 of thin oxide layer 21. Aperture 33 defines the location whereat a P+ source region is to be formed, aperture 35 defines the location whereat a P+ drain region is to be formed, and aperture 34 defines the location whereat an N+ channel barrier region is to be formed in the top gate between the source and drain regions. Using the patterned photoresist layer 31 as a mask, N-type ions (e.g. phosphorous ions) are implanted in the surface of N top gate 23, to a depth on the order of 0.03 to 0.35 microns and an implanted dose on the order of $10^{13}$ cm$^{-2}$ thereby forming shallow high impurity concentration N+ surface regions 53, 54 and 55, as shown in FIG. 2.

Next, as shown in FIG. 3, a second photoresist layer 61 is formed atop the structure of FIG. 2 and then selectively patterned so as to completely expose apertures 33 and 35 in photoresist layer 31, via apertures 63 and 65, respectively, and to remove material of photoresist layer 61 therefrom down to surface portions 43 and 45 on thin oxide layer 21. The selective patterning of the second photoresist layer 61, however, does not remove material from aperture 34 in photoresist layer 31, so that high impurity concentration region 54 therebeneath is masked by photoresist layer 61.

Following the patterning of photoresist layer 61, ions of the same conductivity type as the underlying channel (P-type ions, such as boron ions, in the present example) are implanted through apertures 63 and 65 in photoresist layer 61 and the exposed first and second apertures 33 and 35 of photoresist layer 31, so as to form respective source and drain regions 73 and 75, which extend from surface 15 to overlap P channel layer 25. The concentration of implanted P-type ions of this second implant step, with an implanted dose on the order of $10^{15}$ cm$^{-2}$, is sufficient to override or compensate for N+ surface regions 53 and 55. Because the locations at which source and drain regions 73 and 75 are implanted are defined by the mask pattern in photoresist mask 31, the source and drain regions are self-aligned with the previously implanted high impurity concentration barrier region 54, which has been masked by photoresist layer 61.

Following this second implant step, photoresist layers 31 and 61 are removed and the implanted regions are activated by annealing. Thereafter, a subsequent photoresist mask (not shown) is formed and patterned to provide contact apertures through the oxide and contact metal is formed to complete the device.

As noted previously, because source and drain regions 73 and 75, respectively, are formed through the same mask (mask 31) through which high impurity concentration N+ barrier region 54 is formed during the initial implant (FIG. 2), the source and drain regions are effectively self-aligned with this channel barrier region, so that the necessary spacing between channel barrier region 54 and the source and drain regions is precisely maintained, thereby ensuring that the intended source/drain breakdown voltage (e.g. on the order of 30 volts) of the JFET is obtained.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. A method for manufacturing a junction field effect transistor comprising the steps of:
   (a) forming a top gate region of a first conductivity type and a channel region of a second conductivity type in a first portion of a semiconductor substrate of said first conductivity type;

(b) forming a first mask layer overlying said top gate region, said first mask layer having first and second apertures therein, overlying locations whereat respective source and drain regions are to be formed through said top gate region, and a third aperture therein overlying a location in said top gate layer whereat a channel barrier region is to be formed;

(c) introducing impurities of said first conductivity type through the apertures in said first mask layer to form, in said top gate layer, respective first, second and third surface regions the impurity concentration of which is greater than that of said top gate region;

(d) forming a second mask layer overlying said first mask layer, said second mask layer having first and second apertures therein, overlying locations whereat respective source and drain regions are to be formed through said top gate region and thereby exposing the first and second apertures in said first mask layer, but masking the location in said top gate layer whereat said third surface region has been is formed in step (c); and (e) introducing impurities of said second conductivity type through the first and second apertures in each of said first and second mask layers, to form respective source and drain regions which extend through said top gate layer and intersect said channel layer therebeneath, and the impurity concentration of which is greater than that of said first and second surface regions.

2. A method according to claim 1, wherein steps (c) and (e) comprise implanting ions of said first and second conductivity types, respectively.

3. A method according to claim 2, wherein step (a) comprises the steps of (a1) forming a thin insulator layer on a first surface portion of said semiconductor substrate, (a2) implanting ions of said first conductivity type through said thin insulator layer to form said gate region, and (a3) implanting ions of said second conductivity type through said thin insulator layer to form said channel region therebeneath, and wherein step (b) comprises forming said first mask layer overlying said thin insulator layer, so the first and second apertures therein extend to said thin insulator layer and overlie locations whereat respective source and drain regions are to be formed through said top gate region, and said third aperture therein extends to said thin insulator layer and overlies the location in said top gate layer whereat said channel barrier region is to be formed.

4. A method according to claim 2, wherein the area of exposure to each of the first and second apertures in said first mask layer provided by the first and second apertures, respectively, in said second mask layer is greater than the area of exposure through each of the first and second apertures in said first mask layer.

5. A method according to claim 1, further including the steps of:

(f) removing the first and second mask layers formed in steps (b) and (d); and (g) annealing the regions formed by the introduction of impurities in steps (c) and (e) so as to activate the introduced impurities.

6. A method forming a first semiconductor region of a first conductivity type and a second semiconductor region of a second conductivity type in a semiconductor substrate, such that said first and second semiconductor regions are precisely spatially oriented with respect to one another comprising the steps of:

(a) forming a first mask layer overlying said substrate, said first mask layer having first and second apertures therein which overlie locations whereat said respective first and second semiconductor regions are to be formed in said substrate;

(b) introducing impurities of said first conductivity type through said first and second apertures in said first mask layer to form, in said substrate, respective first and second surface regions of said first conductivity type;

(c) forming a second mask layer overlying said first mask layer, said second mask layer having a third aperture therein of a size larger than said second aperture and exposing the entirety of said second aperture in said first mask layer, while masking the first aperture in said first mask layer;

(d) introducing impurities of said second conductivity type through said third aperture in said second mask and the second aperture in said first mask, so as to form said second semiconductor region of said second conductivity type in said substrate, the concentration of the impurities of said second conductivity type being sufficiently large such that the first conductivity type of said second semiconductor surface region of said first conductivity type is converted to said second conductivity type;

(e) removing said first and second mask layers; and (f) annealing said first and second regions to activate the impurities introduced therein in steps (b) and (d).

7. A method according to claim 6, wherein steps (b) and (d) comprise implanting ions of said first and second conductivity types, respectively.

8. A method according to claim 7, wherein step (b) comprises forming said first mask layer overlying a thin insulator layer provided on the surface of said substrate, so that the first and second apertures in said first mask layer extend to said thin insulator layer and overlie locations whereat said first and second semiconductor regions, respectively, are to be formed therebeneath.

* * * * *